(12) United States Patent
Nishimura et al.

(10) Patent No.: US 12,170,200 B2
(45) Date of Patent: *Dec. 17, 2024

(54) CRYSTAL GROWTH METHOD AND A SUBSTRATE FOR A SEMICONDUCTOR DEVICE

(71) Applicant: KYOCERA Corporation, Kyoto (JP)

(72) Inventors: Takehiro Nishimura, Kusatsu (JP); Chiaki Doumoto, Goleta, CA (US)

(73) Assignee: KYOCERA Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/565,831

(22) Filed: Dec. 30, 2021

(65) Prior Publication Data

US 2022/0122839 A1    Apr. 21, 2022

Related U.S. Application Data

(63) Continuation of application No. 16/254,031, filed on Jan. 22, 2019, now Pat. No. 11,244,826.

(30) Foreign Application Priority Data

Jan. 31, 2018    (JP) .................................. 2018-015982

(51) Int. Cl.
*H01L 21/02*    (2006.01)
*C30B 25/04*    (2006.01)
(Continued)

(52) U.S. Cl.
CPC .......... *H01L 21/0262* (2013.01); *C30B 25/04* (2013.01); *C30B 29/403* (2013.01);
(Continued)

(58) Field of Classification Search
CPC ........... H01L 21/0262; H01L 21/02389; H01L 21/02458; H01L 21/0254; H01L 21/02647; H01L 21/0337; C30B 25/04; C30B 29/406
See application file for complete search history.

(56) References Cited

U.S. PATENT DOCUMENTS 6,030,849 A * 2/2000 Hasegawa ......... H01L 21/02647
117/106
2001/0053618 A1   12/2001 Kozaki et al.
(Continued)

FOREIGN PATENT DOCUMENTS

JP    2002-261032 A    9/2002
JP    2003-037066 A    2/2003
(Continued)

*Primary Examiner* — Julia Slutsker
(74) *Attorney, Agent, or Firm* — Volpe Koenig

(57) ABSTRACT

A crystal growth method of the present disclosure includes: preparing a crystal growth-derived-layer forming substrate including (a) a substrate having a surface layer, (b) a mask pattern which is formed on the surface layer and which includes a plurality of strip bodies, and (c) a plurality of crystal growth-derived layers which are formed between and on the plurality of stripe bodies so as to have gaps therebetween above the plurality of strip bodies and which differ in lattice constant from the substrate having the surface layer; and growing semiconductor layers on the plurality of crystal growth-derived layers. The semiconductor layers are respectively grown on the plurality of crystal growth-derived layers formed so as to be separated from each other, and semiconductor layers on two adjacent ones of the plurality of crystal growth-derived layers are separated from each other.

10 Claims, 11 Drawing Sheets

(51) Int. Cl.
*C30B 29/40* (2006.01)
*H01L 21/033* (2006.01)

(52) U.S. Cl.
CPC ...... *C30B 29/406* (2013.01); *H01L 21/02389* (2013.01); *H01L 21/02433* (2013.01); *H01L 21/02458* (2013.01); *H01L 21/02494* (2013.01); *H01L 21/0254* (2013.01); *H01L 21/02639* (2013.01); *H01L 21/02642* (2013.01); *H01L 21/02647* (2013.01); *H01L 21/0337* (2013.01)

(56) References Cited

U.S. PATENT DOCUMENTS

| | | |
|---|---|---|
| 2007/0085093 A1 | 4/2007 | Ohmae et al. |
| 2007/0099329 A1 | 5/2007 | Maa et al. |
| 2008/0001169 A1* | 1/2008 | Lochtefeld ............ H01L 29/267 257/190 |
| 2011/0031529 A1* | 2/2011 | Miura ............... H01L 21/02381 257/E31.037 |
| 2012/0097975 A1* | 4/2012 | Lee ................... H01L 21/02647 257/77 |
| 2013/0230974 A1 | 9/2013 | Martinez et al. |
| 2015/0102358 A1 | 4/2015 | Choe |
| 2016/0064492 A1* | 3/2016 | Li ....................... H01L 21/8258 257/190 |
| 2018/0315659 A1* | 11/2018 | Dasgupta ............ H01L 21/8252 |

FOREIGN PATENT DOCUMENTS

| | | |
|---|---|---|
| JP | 2005-064469 A | 3/2005 |
| JP | 2006-315985 A | 11/2006 |
| JP | 2007-116097 A | 5/2007 |
| JP | 2015-097261 A | 5/2015 |

\* cited by examiner

CRYSTAL GROWTH METHOD AND A SUBSTRATE FOR A SEMICONDUCTOR DEVICE

CROSS-REFERENCE TO RELATED APPLICATION

This application is a Continuation of U.S. patent application Ser. No. 16/254,031 filed Jan. 22, 2019 which claims priority to Japanese Patent Application No. 2018-015982, which was filed on Jan. 31, 2018, the contents of which are incorporated herein by reference in their entireties.

BACKGROUND OF THE INVENTION

1. Field of the Invention

The present invention relates to a crystal growth method and a semiconductor device manufacturing method.

2. Description of the Related Art

There is a heretofore known crystal growth method for carrying out crystal growth of an AlGaN layer on a GaN substrate (refer to Japanese Unexamined Patent Publication JP-A 2005-64469).

SUMMARY OF THE INVENTION

An improvement in semiconductor layer quality has customarily been demanded in the formation of a crystal growth-derived layer which differs in lattice constant from the substrate.

A crystal growth method according to the present disclosure comprises: preparing a substrate having a surface layer; forming a mask pattern including a plurality of strip bodies on the surface layer to separate the surface layer into segments by the plurality of strip bodies and expose part of the surface layer; and forming, on a plurality of growth regions constituted by the exposed part of the surface layer, a crystal growth-derived layer by causing a semiconductor crystal which differs in lattice constant from the substrate to grow by a vapor-phase growth process, each of the plurality of strip bodies having side faces inclined so that a width between the side faces gradually decreases with distance from the surface layer.

A semiconductor device manufacturing method according to the present disclosure comprises forming the crystal growth-derived layer by the crystal growth method mentioned above; and forming a semiconductor device with use of the crystal growth-derived layer.

According to the crystal growth method according to the present disclosure, the quality of a crystal growth-derived layer can be improved.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
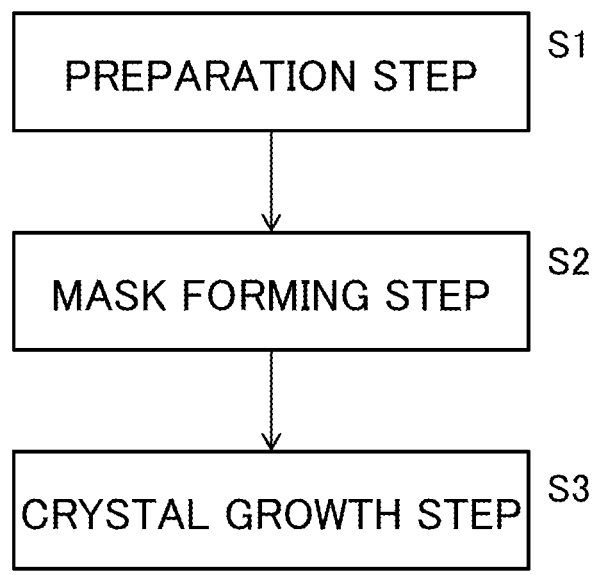
FIG. 1 is a flow chart for a crystal growth method according to the present embodiment.

Now referring to the drawings, preferred embodiments of the invention are described below. FIG. 1 is a flow chart for a crystal growth method according to the present embodiment. The crystal growth method according to the present embodiment comprises: a preparation step S1 of preparing a substrate; a mask forming step S2 of forming a mask pattern on the substrate; and a crystal growth step S3 of causing a nitride semiconductor to grow on the substrate. As employed herein "nitride semiconductor" refers to, for example, a semiconductor formed of $Al_xGa_yIn_zN$ (wherein $0 \le x \le 1$; $0 \le y \le 1$; $0 \le z \le 1$; $x+y+z=1$).

(1) Preparation Step S1

Figure 2:
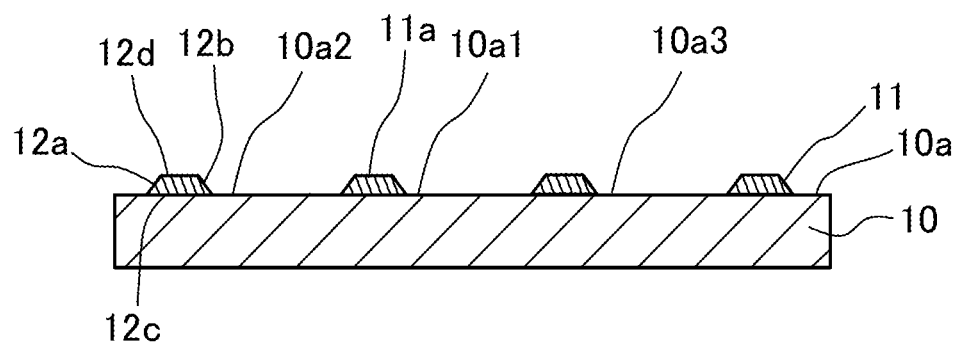
FIG. 2 is a explanatory sectional view of the crystal growth method according to the present embodiment.

FIG. 2 is a sectional view showing the crystal growth method according to the present embodiment. A substrate 10 having a surface layer is prepared first. For example, the substrate 10 may be built as a nitride semiconductor substrate. Alternatively, the substrate 10 may be built as an n-type or p-type substrate made of a nitride semiconductor doped with impurities. For example, a substrate having a defect density of $1 \times 10^5/cm^3$ or less is used.

As the substrate 10, in so far as at least a surface layer thereof is made of a nitride semiconductor, it is possible to use other substrate than a GaN substrate, for example, a sapphire substrate or a SiC substrate with a GaN layer formed on a surface thereof. Moreover, in the case where the substrate 10 is a nitride semiconductor substrate, the surface layer of the substrate 10 is not limited to a GaN layer.

In the present embodiment, a GaN substrate cut from a GaN single crystal ingot is used for the substrate 10.

With regard to a crystal plane orientation of the nitride semiconductor with respect to the normal to the substrate 10, crystal planes such as A-plane (11-20), C-plane (0001), M-plane (1-100), and R-plane (1-102) may be used. The crystal plane may be appropriately selected according to the type of a device which is formed on the substrate 10. Moreover, it is possible to use a substrate having an off-angled plane inclined at several degrees with respect to the aforenamed crystal planes, being called an off-angle substrate.

(2) Mask Forming Step S2

Figure 3:
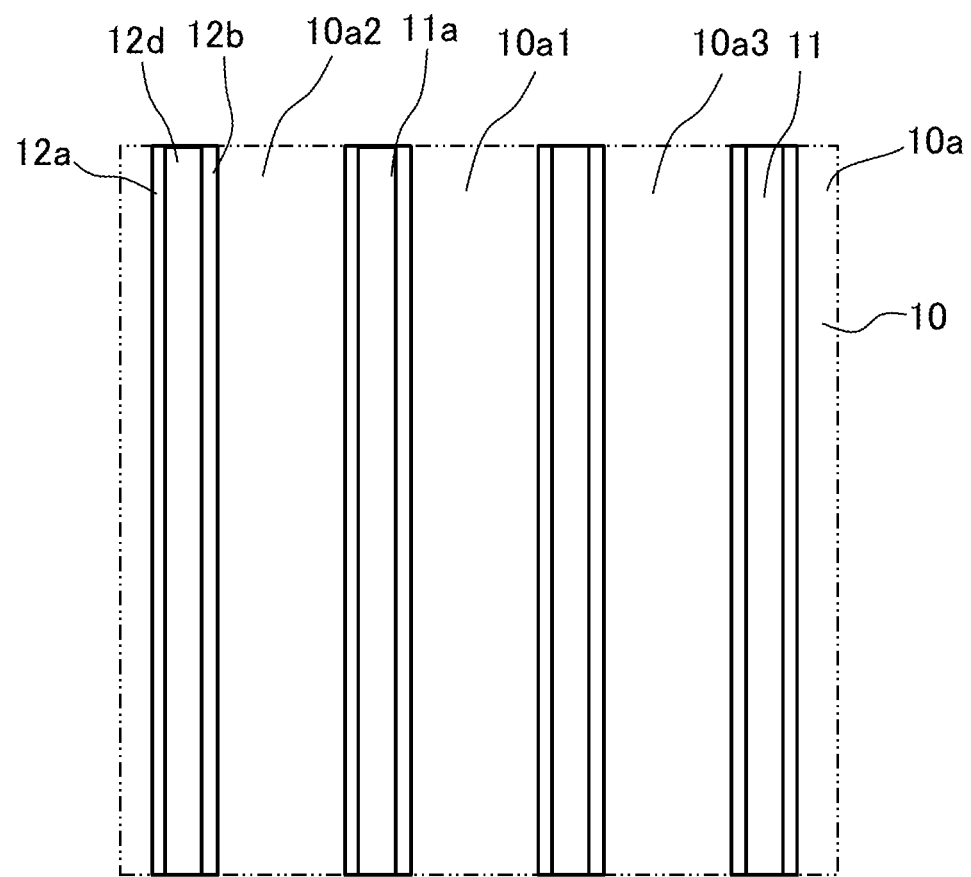
FIG. 3 is a plan view showing an example of a mask pattern.

In the subsequent mask forming step, a mask pattern is formed on the substrate 10 prepared as a GaN substrate in the above-described preparation step. At the outset, as the material of formation of a mask, $SiO_2$ is deposited on the substrate 10 by PCVD (Plasma Chemical Vapor Deposition) or otherwise to form a $SiO_2$ layer in the form of a mask layer having a predetermined thickness on a surface layer 10*a* of the substrate 10. Then, the $SiO_2$ layer is subjected to patterning using photolithography and HF (hydrogen fluoride) wet etching or dry etching to form a mask pattern 11 as shown in FIGS. 2 and 3. The mask pattern has a striped configuration defined by a plurality of strip bodies 11*a* arranged parallel to one another at predetermined intervals.

The mask pattern 11 provides the surface layer 10*a* with growth regions 10*a*1, 10*a*2, and 10*a*3 separated by the plurality of strip bodies 11*a*. Each of the growth regions 10*a*1, 10*a*2, and 10*a*3 corresponds to a region in which the surface layer 10*a* of the substrate 10 is exposed, and serve to carry out crystal growth of the nitride semiconductor in the subsequent crystal growth step.

As the mask-forming material for forming the mask pattern 11, it is possible to use, in addition to $SiO_2$, any material as long as a semiconductor layer does not grow from the mask-forming material by vapor phase epitaxy, and, for example, patterning-capable oxide such as ZrOx, TiOx, and AlOx, and transition metal such as W and Cr. Moreover, the mask layer may be formed by any depositing method suited to the mask-forming material, such as vapor deposition, sputtering, or a coating-curing technique. For example, in the process of vapor phase epitaxy of AlGaN, if $SiO_2$ is included in the mask-forming material, there is a possibility that AlGaN grows from the mask pattern. Thus, in such a case, other material such as W and/or Cr may be used.

Figure 4:
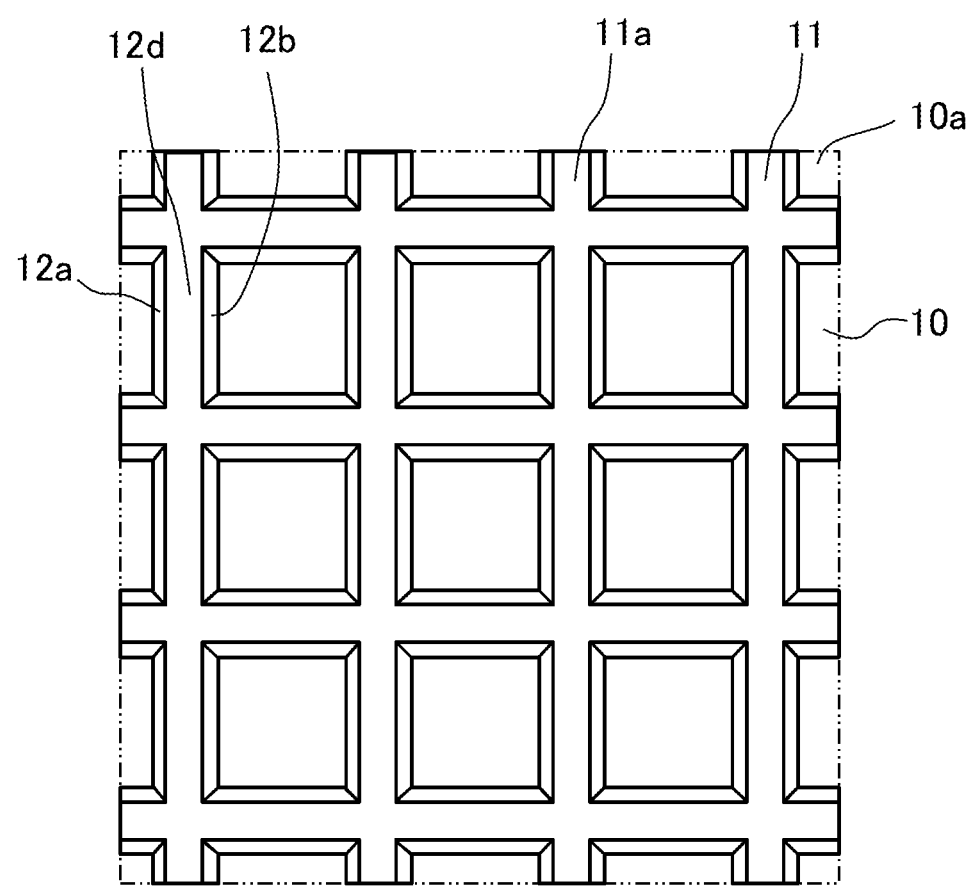
FIG. 4 is a plan view showing an example of the mask pattern.

The mask pattern 11 formed on the substrate 10 in plan configuration may be, in addition to the above-described striped pattern, a lattice configuration defined by a plurality of strip bodies 11*a* arranged in rows and columns, as shown in FIG. 4. Such a mask pattern 11 may be utilized for delimitation of device regions of semiconductor devices which are formed on the substrate 10. the mask pattern 11 is also useful in device division to form a plurality of discrete semiconductor devices on the substrate 10. In another alternative, the mask pattern 11 may be a nested configuration or a staggered configuration.

In the mask pattern 11 in striped form, a longitudinal direction of the strip body 11*a* may be appropriately selected according to the type of a device to be produced. For example, in the case of producing a semiconductor laser device, the strip body 11*a* is formed so that a longitudinal direction thereof is aligned with the direction of the m-axis [1-100] of the crystal plane of the GaN substrate and a cleaved surface corresponds to the m-plane.

The strip body 11*a* has a transverse section shaped so that a transverse width thereof gradually decreases with distance from the surface layer 10*a*, and the strip body 11*a* has such a shape that inclined side faces 12*a* and 12*b* are discernible as seen in a plan view from above the substrate 10. For example, the strip body 11*a* has a trapezoidal or triangular transverse section, that is, a sectional profile in which a bottom face 12*c* contacting the surface layer 10*a* is larger than a top face 12*d* thereof.

(3) Crystal Growth Step S3

Figure 5:
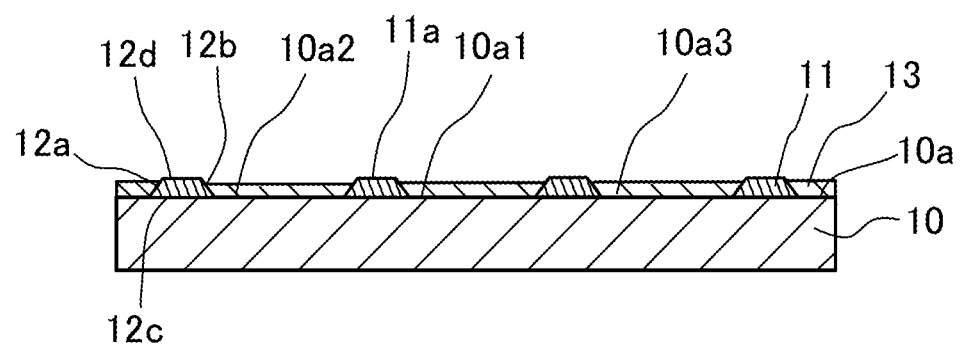
FIG. 5 is an explanatory sectional view of a semiconductor device manufacturing method according to the present embodiment.
Figure 6:
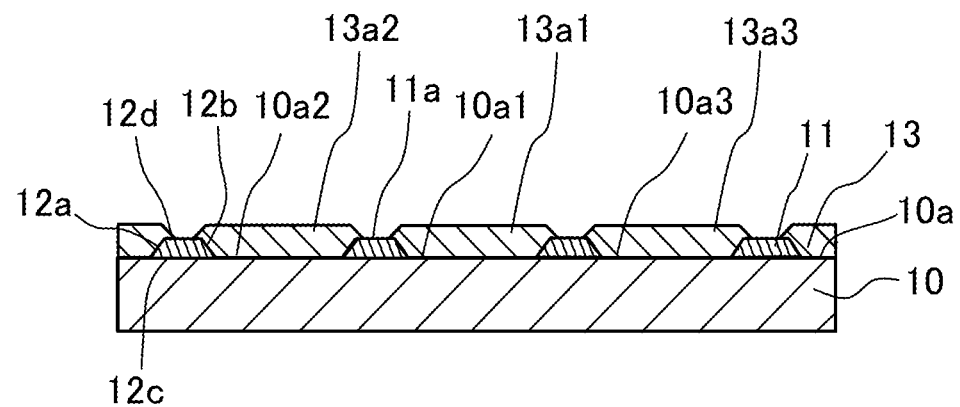
FIG. 6 is an explanatory sectional view of the semiconductor device manufacturing method according to the present embodiment.

Subsequently, in the crystal growth step, as shown in FIGS. 5 and 6, vapor-phase growth (epitaxial growth) of a semiconductor layer 13, which serves as a crystal growth-derived semiconductor layer of the semiconductor crystal, is carried out on the growth regions 10*a*1, 10*a*2, and 10*a*3. The semiconductor layer of the present disclosure 13 is a nitride semiconductor layer, or more specifically an AlGaN layer.

In the crystal growth step, the substrate 10 formed with the mask pattern 11 is inserted in a reaction tube of an epitaxial growth apparatus, and, under the supply of a hydrogen gas, a nitrogen gas or a gas mixture of hydrogen and nitrogen, and a Group V-based raw material gas such as ammonia, the temperature of the substrate 10 is raised to a predetermined growth temperature. After temperature stabilization, in addition to the aforenamed gases, a Group III-based raw material gas such as Ga, In, or Al is supplied to cause the semiconductor layer 13 to grow from the growth regions 10*a*1, 10*a*2, and 10*a*3. The crystal growth method may adopt VPE (Vapor Phase Epitaxy) based on the chloride transport method using chloride as a Group III-based raw material, or MOCVD (Metal Organic Chemical Vapor Deposition) using an organic metal as a Group III-based raw material. The semiconductor layer 13 may be formed in multi-layer form by varying the proportion of the Group III element in the raw material gas and/or the proportion of the impurity in the raw material gas during the growth process.

For example, in the case of causing an AlGaN layer serving as the semiconductor layer 13 to grow on the growth regions 10*a*1, 10*a*2, and 10*a*3 by MOCVD, in the epitaxial growth apparatus in which the substrate 10 having being formed with the mask pattern 11 is received, epitaxial growth is carried out on the substrate 10 set at a temperature of about 1050° C. while flowing a gas mixture of hydrogen and nitrogen, and ammonia and trimethyl gallium gas (TMG) serving as the raw material gas. At this time, by supplying a raw material gas of impurities, for example, n-type impurities such as Si or p-type impurities such as Mg, it is possible to obtain AlGaN of desired conductive type.

As shown in FIG. 5, since the semiconductor layer 13 from each of the growth regions 10*a*1, 10*a*2, and 10*a*3 grows in a direction perpendicular to the plane of the region, as well as in a direction parallel to the plane, the semiconductor layer 13 grows along the side faces 12*a* and 12*b* of the strip body 11*a*. Moreover, when the semiconductor layer 13 grows beyond a the height of the strip body 11*a*, the semiconductor layer 13 further grows along the top face 12*d* of the strip body 11*a* transversely.

As shown in FIG. 6, the crystal growth step is terminated before the semiconductor layers 13 having grown from on their respective growth regions 10*a*1, 10*a*2, and 10*a*3 do not overlap each other. For example, the crystal growth step is terminated in a state where a semiconductor layer 13*a*1 having grown from on the growth region 10*a*1 does not overlap adjacent semiconductor layers 13*a*2 and 13*a*3 having grown from on the growth regions 10*a*2 and 10*a*3, respectively. That is, the crystal growth is stopped in a state where the semiconductor layer 13*a*1 having grown on one of growth regions and the semiconductor layers 13*a*2 and 13*a*3 having grown on the other growth regions, all of which growth regions are disposed adjacent to each other via the strip bodies 11a, are disposed away from each other, and the crystal growth step is terminated.

Figure 7:
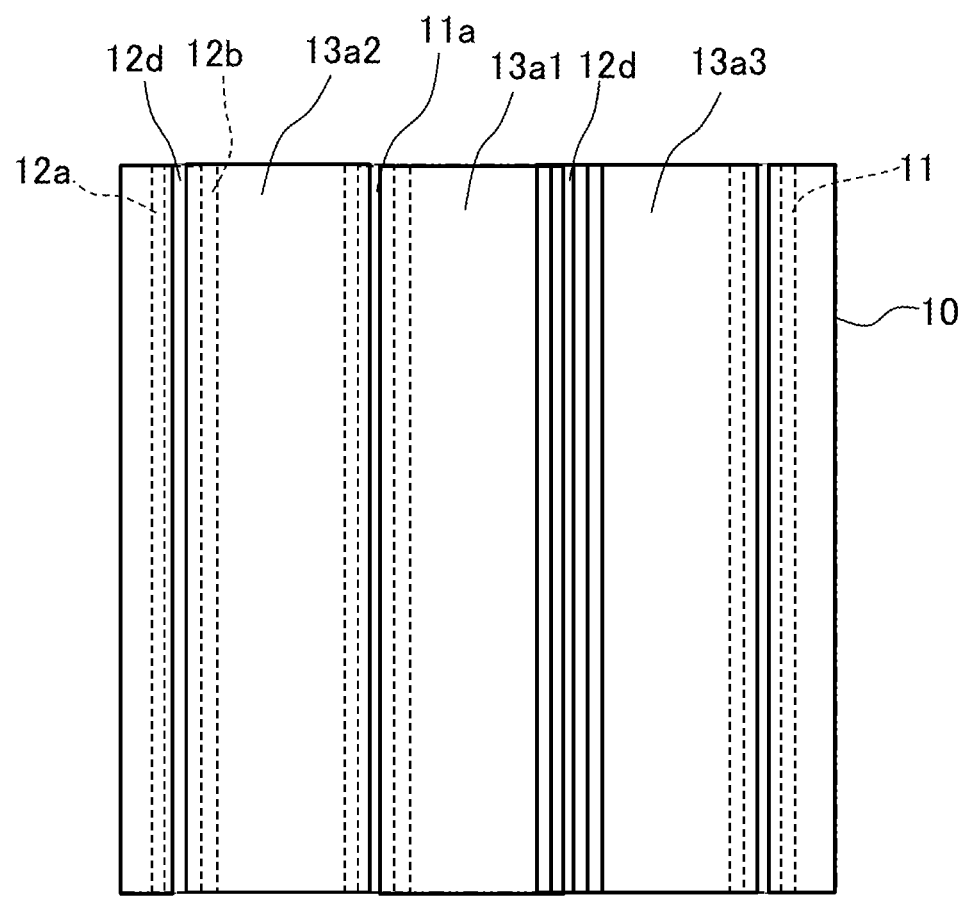
FIG. 7 is an explanatory plan view of the semiconductor device manufacturing method according to the present embodiment.

FIG. 7 is a plan view showing a procedure in a semiconductor device manufacturing method according to the present embodiment. When the substrate 10 is seen in a plan view from above following completion of the crystal growth step, the semiconductor layer 13a1 is disposed away from the semiconductor layers 13a2 and 13a3, and, at each edge of the semiconductor layer 13, the top face 12d of the strip body 11a is exposed. If the adjacent semiconductor layers 13 are contiguous with each other at their edges, the edges will be prone to generate cracks and crystal defects. In this regard, since the adjacent semiconductor layers 13 are disposed away from each other, it is possible to reduce generation of cracks and crystal defects at the edges of the semiconductor layers 13.

Moreover, for example, in a substrate obtained by performing dry etching on the order of micro meters on a GaN substrate, even if a mask is applied to protect an epitaxial-growth target area, damage to the substrate surface is so great that cracks and crystal defects may increase. In consequence, cracks and crystal defects are included in an epitaxially grown layer, and quality degradation in the resulting crystal growth-derived layer is caused. To alleviate this, cracks and crystal defects in a crystal-growth target region need to be reduced by performing, following completion of low-intensity dry etching, a GaN buffer layer-growing process on the crystal-growth target region. This, unfortunately, leads to an increase in man-hours, which may result in cost increases. In the present embodiment, since the growth regions 10a1, 10a2, and 10a3 on the substrate 10 are not subjected to any process which tends to cause cracks and crystal defects, this makes it possible to grow the semiconductor layer 13 at a growth region which suffers little from cracks and crystal defects, and thereby improve the quality of the semiconductor layer 13 without the necessity of conducting extra process, and to improve the quality of a nitride semiconductor produced on the substrate.

Figure 8:
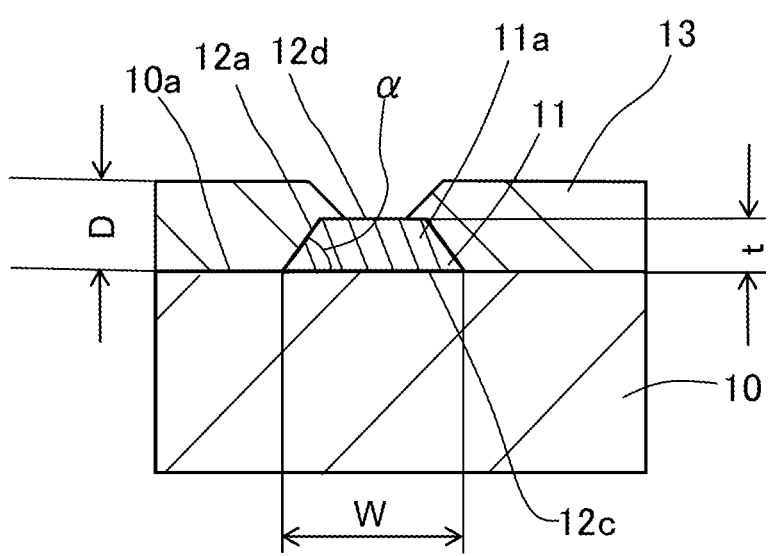
FIG. 8 is an explanatory enlarged sectional view of the semiconductor device manufacturing method according to the present embodiment.

FIG. 8 is an enlarged sectional view of the strip body 11a of the mask pattern 11 and nearby portions. For example, the strip body 11a may be formed to have a trapezoidal transverse section in which the bottom face 12c contacting the substrate 10 is larger than the top face 12d, or a triangular transverse section whose bottom side lies on the substrate 10. An angle defined by each of the side faces 12a and 12b and the surface of the substrate 10, namely an angle α formed between each of the side faces 12a and 12b and the surface layer 10a, may be adjusted to be greater than or equal to 30° but less than 90°.

For example, in the mask as viewed in section, if the top face 12d is larger than the bottom face 12c contacting the substrate 10, expressed differently, if the strip body 11a has its sides formed to extend from the upper end thereof toward the surface layer 10a while sloping toward the outer edge of the growth region, voids may tend to occur between the mask and the surface layer 10a. With this in view, the strip body 11a is configured to have a section in which the bottom face 12c is larger than the top face 12d to reduce the occurrence of voids. Furthermore, as the growth of a nitride semiconductor proceeds, the growing layer grows along the side faces 12a and 12b of the mask to spread further in the direction of the plane of the substrate. At this time, by virtue of the earlier described inclined side faces 12a and 12b of the strip body 11a, the growing layer is able to grow along the substrate 10 without obstruction, and consequently the resulting layer is less prone to generate cracks and crystal defects.

While the height of the strip body 11a from the upper end of the strip body 11a to the surface layer 10a of the substrate 10, expressed differently, the thickness of the strip body 11a, should preferably be set at as large a value as possible, even if the semiconductor layer 13 grows beyond the height (thickness) of the strip body 11a, on condition that the strip body 11a has a sufficiently large width, the semiconductor layer 13a1 which grows on one growth region 10a1 serving as a growth onset area can be located away from the semiconductor layers 13a2 and 13a3 which grow on growth regions 10a2 and 10a3 adjacent to the growth region 10a1, respectively, each serving as a growth onset area.

It is possible to avoid that the semiconductor layer 13a1 will overlap other semiconductor layers having grown on adjacent growth regions by fulfilling the relationship of the following expression (1):

$$W/2-(D-t)\times n > t/\tan\alpha \text{(in units of μm)} \quad (1)$$

wherein D represents the thickness of the grown semiconductor layer 13, t represents the height of the strip body 11a, W represents the width of the bottom face 12c of the strip body 11a, and n represents the ratio of a growing rate in the planar direction (for example, in the direction of m-axis) to a growing rate in the direction normal to the substrate 10 (for example, in the direction of c-axis). For example, on condition that a is set at 90°, where D=2 μm, t=0.5 μm, and n=1, then the width W of the strip body 11a is adjusted to be 3 μm or more; where D=2 μm, t=1.0 μm, and n=4, then the width W of the strip body 11a is adjusted to be 8 μm or more; and where D=2 μm, t=0.2 μm, and n=4, then the width W of the strip body 11a is adjusted to be 14.4 μm or more.

Moreover, the advantage of the trapezoidal configuration is that the limit of transverse growth can be determined by the angle of inclination. Thus, by carrying out in-situ film thickness measurement by, for example, a reflection spectrometry-based film thickness meter manufactured by Laytec AG with concurrent use of a pyrometer customarily adopted for use in MOCVD, the control of the range of transverse growth can be improved. In a selective-area growth process using masks, it may be difficult to determine optimal growth conditions to render the rate of transverse growth uniform throughout the range of the plane of the substrate. In this regard, by the application of in-situ film thickness measurement in pyrometry for the design of the trapezoidal configuration of the strip body 11a, the control of the configuration of the semiconductor layer 13 can be improved.

Thus, by setting the width W of the mask to be sufficiently large, one semiconductor layer 13 having grown in a predetermined thickness on one growth region does not overlap other semiconductor layer 13 having grown on other growth region which is adjacent, via the strip body 11a, to the one growth region, and a space to uncover the top face 12d of the strip body 11a can be created. Moreover, in the case for the mask pattern 11 in striped form, the spacing between the adjacent strip bodies 11a may be created to fall in the range of about 50 μm to 1000 μm, depending on the shape of a semiconductor device which is formed on the substrate. In a state where the semiconductor layer 13a1 does not overlap the semiconductor layers 13a2 and 13a3, the crystal growth step is terminated.

Figure 9:
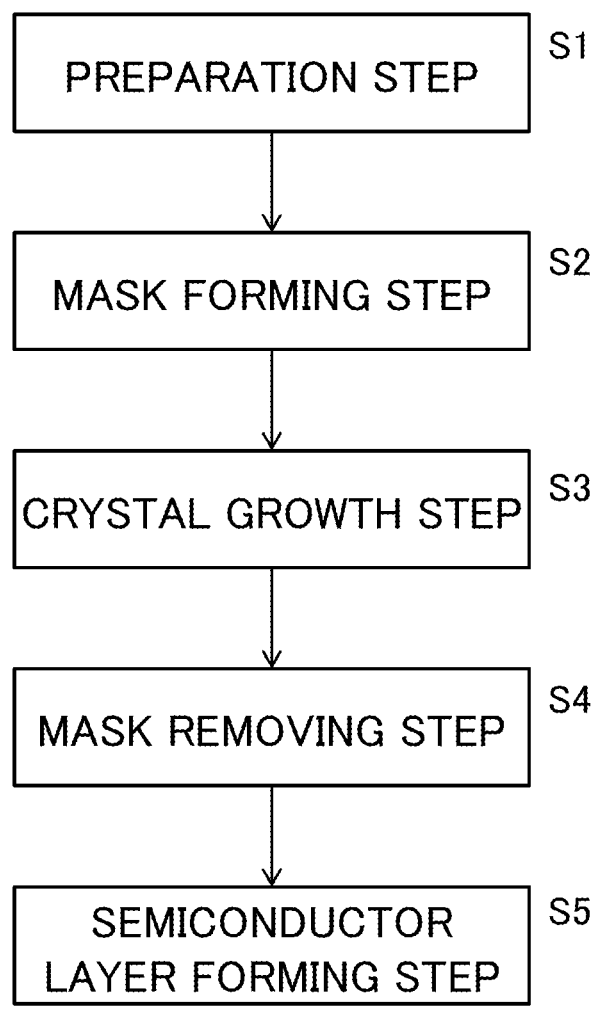
FIG. 9 is a flow chart for the semiconductor device manufacturing method according to the present embodiment.

FIG. 9 is a flow chart for the semiconductor device manufacturing method according to the present embodiment. Following completion of formation of the semiconductor layer 13 in accordance with the above-described crystal growth method including the preparation step S1, the mask forming step S2 of forming a mask pattern on the substrate, and the crystal growth step S3 of causing a nitride semiconductor to grow on the substrate, a mask removing step S4 of removing the mask pattern by etching is carried out, and the nitride-semiconductor crystal growth process is completed. After that, a semiconductor layer forming step S5 of further forming a semiconductor layer on the semiconductor layer 13 is carried out to produce a semiconductor device.

(4) Mask Removing Step S4

Figure 10:
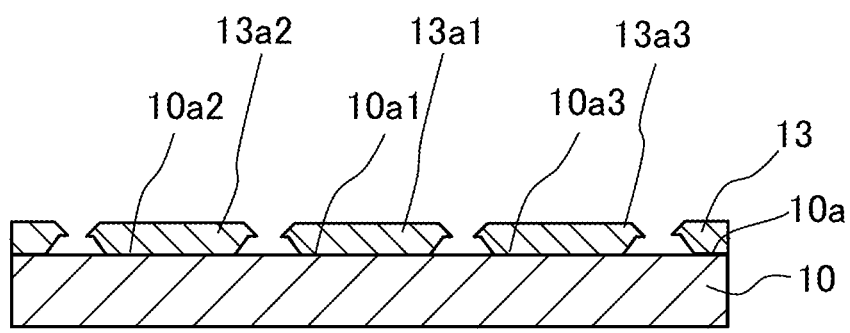
FIG. 10 is an explanatory sectional view of the semiconductor device manufacturing method according to the present embodiment.

Following completion of the crystal growth step S3, as shown in FIG. 10, the mask-forming material is removed by etching using an etchant which does not essentially affect the grown semiconductor layer 13. Where $SiO_2$ is used as the mask-forming material, HF wet etching is performed. Since the mask pattern 11 is exposed from the substrate when seen in a plan view from above, the mask removal can be rapidly carried out. In consequence, for example, a groove structure having an opening of 2 µm or more and a depth of 2 µm or more is formed.

At this time, where the width W of the strip body 11a and the transverse growth ratio n take on large values, a mask-forming material residue may be left after the etching process. Furthermore, even if the etching process is completed successfully, depending on the conditions of the subsequent epitaxial growth process, a cavity called a void may appear in an epitaxially grown layer. Where a void is present, cracks and crystal defects may be generated around the void due to stress concentration, and, the propagation of the cracks to the device-forming region may adversely affect the product quality, such as the light-emission efficiency and service life, of the resulting device.

Thus, in the sectional profile of the strip body 11a of the mask pattern 11 which is subjected to etching, in order to obtain satisfactory void reduction effects, a trapezoidal profile in which the bottom face 12c is wider than the top face 12d is more desirable than a trench-like profile in which the bottom face 12c and the top face 12d have the same width, as well as an inverted trapezoid-like profile in which the top face 12d is longer than the bottom face 12c, and the strip body 11a is preferably configured to have a tapered section in which the bottom face of the strip body 11a is wider than at the top face thereof.

(5) Semiconductor Layer Forming Step S5

Figure 11:
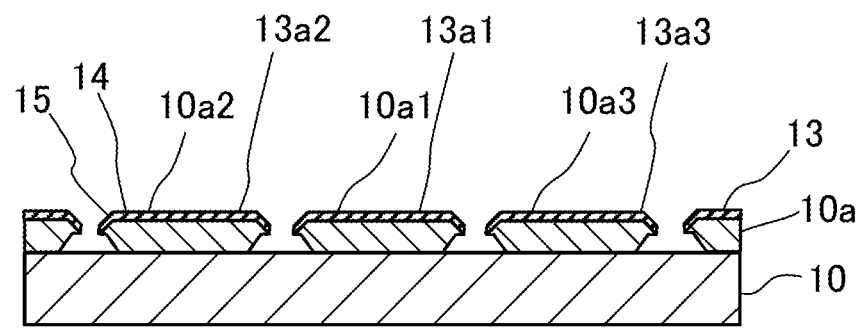
FIG. 11 is an explanatory sectional view of the semiconductor device manufacturing method according to the present embodiment.

After that, as shown in FIG. 11, semiconductor layers 14 such as AlGaN layers required for device production are formed one after another on the semiconductor layer 13 by epitaxial growth to produce a plurality of semiconductor devices 15 on the substrate 10.

For example, a light-emitting device such as LD or LED can be produced by laminating an n-type AlGaN clad layer, an InGan light-emitting layer, a p-type AlGaN clad layer, and a p-type GaN contact layer successively on an n-type GaN layer having grown from the growth region.

(6) Semiconductor Layer Forming Step S6

Figure 12:
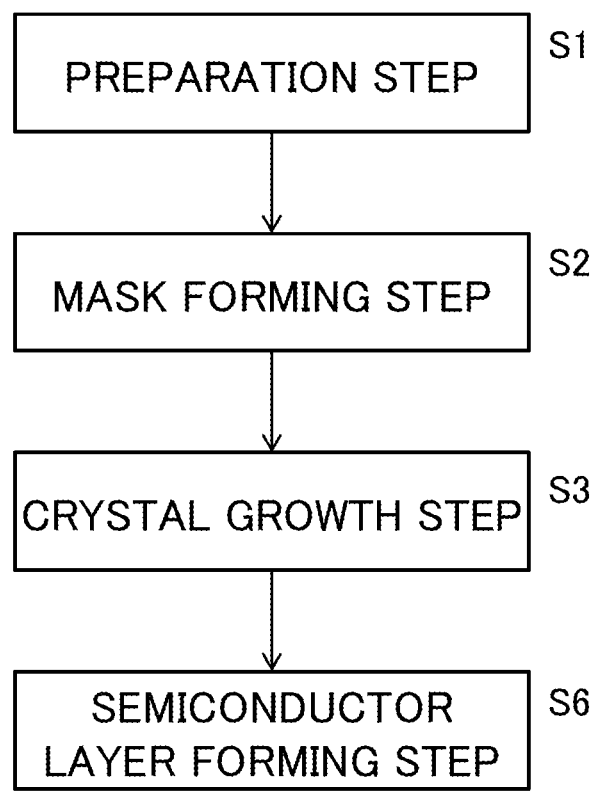
FIG. 12 is a flow chart for a semiconductor device manufacturing method according to another embodiment.

FIG. 12 is another flow chart for the semiconductor device manufacturing method according to the present embodiment. Following completion of formation of the semiconductor layer 13 in accordance with the above-described crystal growth method including the preparation step S1, the mask forming step S2 of forming a mask pattern on the substrate, and the crystal growth step S3 of causing a nitride semiconductor to grow on the substrate, a semiconductor layer is further formed on the semiconductor layer 13 to produce a semiconductor device. After that, a semiconductor layer forming step S6 is carried out to produce a semiconductor device. As contrasted to the foregoing flow chart for the semiconductor device manufacturing method, this flow chart does not include the mask removing step S4 of removing the mask pattern by etching.

The mask removing step S4 may be omitted from the procedure depending on the type of a semiconductor device to be produced. In the case of carrying out epitaxial growth on the semiconductor layer 13 straightaway without conducting the mask removing step, the thickness of the semiconductor layer 13 is adjusted to be 2.5 µm or more.

Figure 13:
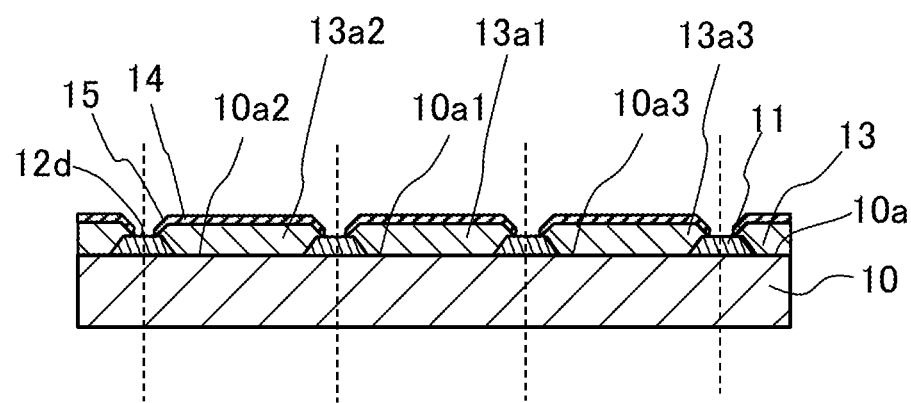
FIG. 13 is an explanatory sectional view of the semiconductor device manufacturing method according to another embodiment.

Then, by causing semiconductor layers 14 such as AlGaN layers required for device production to epitaxially grow on the semiconductor layer 13, semiconductor devices 15 as shown in FIG. 13 can be produced. Thus, where epitaxial growth is carried out straightaway on the semiconductor layer 13, growth processes can be continuously performed in one and the same apparatus.

Following causing the semiconductor layers 14 to epitaxially grow, the substrate 10 can be separated along lines of reference as indicated by the dotted lines shown in FIG. 13, each corresponding to a part of the substrate 10 in which the top face 12d of the strip body 11a is discernibly exposed, as viewed in a plan view. Thus, the resulting devices can be smoothly separated individually.

Figure 14:
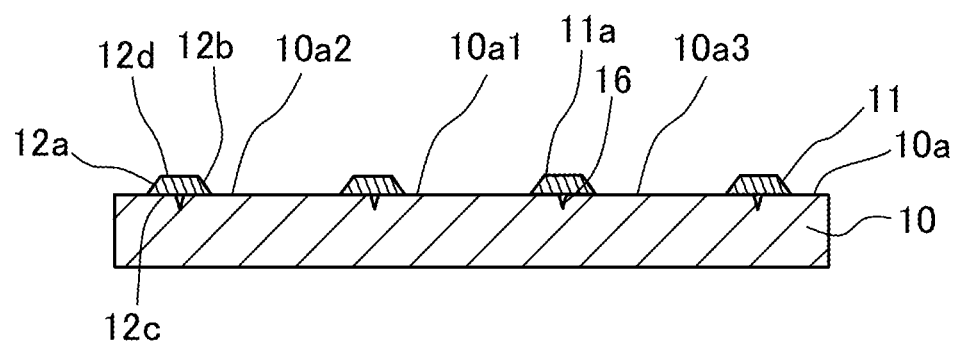
FIG. 14 is an explanatory sectional view of the semiconductor device manufacturing method according to another embodiment.
Figure 15:
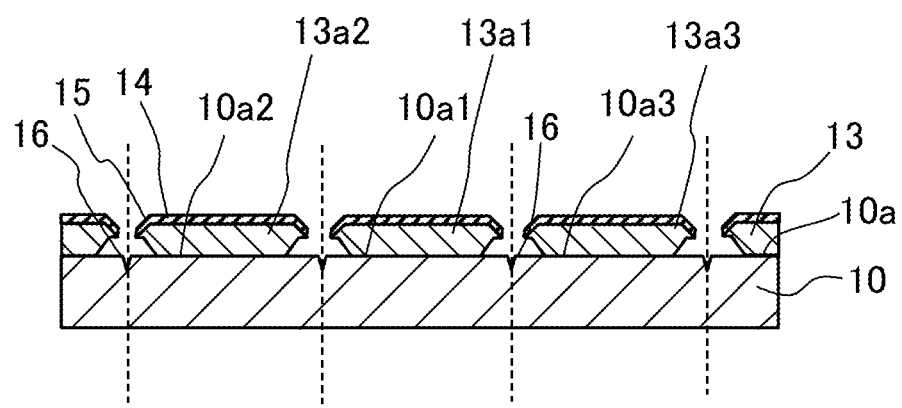
FIG. 15 is an explanatory sectional view of the semiconductor device manufacturing method according to another embodiment.

FIGS. 14 and 15 are each an explanatory sectional view of a semiconductor device manufacturing method according to another embodiment. As shown in FIG. 14, a wedge-shaped groove 16 is scribed or otherwise formed along each striped pattern-forming region of the substrate. A mask pattern is defined along the wedge-shaped grooves in the substrate, and, the strip body 11a is placed on the wedge-shaped groove.

Next, as is the case with the preceding embodiment, the growth of the semiconductor layer 13 is carried out. After that, as seen from the drawing, the mask removing step is carried out. Then, further growth of the semiconductor layer 14 is carried out to form the semiconductor device 15 as shown in FIG. 15.

While the mask pattern 11 serves also as a guide which can be utilized for delimitation of device regions and separation of individual devices, as indicated by the dotted lines shown in FIG. 15, the wedge-shaped groove 16 serves as a cutting guide for separating the substrate, and this permits easy separation of a plurality of individual semiconductor devices formed on the substrate. Therefore, it is possible to further enhance guide functions for delimitation of device regions and separation of individual devices.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method for manufacturing a plurality of semiconductor devices each including a crystal growth-derived layer and a semiconductor layer, the method comprising:
preparing a crystal growth-derived-layer forming substrate including (a) a substrate having a first growth region and a second growth region defined by a non-growth region having a striped configuration, (b) a first crystal growth-derived layer located above the first growth region and the non-growth region, and (c) a second crystal growth-derived layer located above the second growth region and the non-growth region; and growing a first semiconductor layer on the first crystal growth-derived layer and growing a second semiconductor layer on the second crystal growth-derived layer, wherein:
  the first semiconductor layer and the second semiconductor layer are separated from each other and are adjacent to each other, and the first crystal growth-derived layer and the second crystal growth-derived layer are separated from each other,
  each of the first crystal growth-derived layer and the second crystal growth-derived layer has a lower portion joined to the substrate,
  the lower portion has a width that gradually increases with distance from the substrate,
  each of the first crystal growth-derived layer and the second crystal growth-derived layer includes a nitride semiconductor, and
  a longitudinal direction of the striped configuration is aligned with a direction of an m-axis of both the first crystal growth-derived layer and the second crystal growth-derived layer.

2. The method according to claim 1, wherein:
a material of the first crystal growth-derived layer and the second crystal growth-derived layers is different from a material of the substrate.

3. The method according to claim 1, wherein:
each of the first crystal growth-derived layer and the second crystal growth-derived layer has an upper portion located above of the lower portion; and
the upper portion has a width that gradually decreases with distance from the lower portion.

4. The method according to claim 3, wherein:
the upper portion has an inclined surface inclining with respect to a normal line of the substrate.

5. The method according to claim 4, wherein:
the first semiconductor layer is in contact with the inclined surface of the first crystal growth-derived layer; and
the second semiconductor layer is in contact with the inclined surface of the second crystal growth-derived layer.

6. The method according to claim 4, wherein:
the non-growth region is a mask pattern; and
the inclined surface intersects the mask pattern.

7. The method according to claim 1, wherein:
each of the semiconductor layer and the second semiconductor layer includes a light-emitting layer.

8. A method for manufacturing a plurality of semiconductor devices each including a crystal growth-derived layer and a semiconductor layer, the method comprising:
preparing a crystal growth-derived-layer forming substrate including (a) a substrate having a first growth region and a second growth region defined by a non-growth region having a mask pattern, (b) a first crystal growth-derived layer located above the first growth region and the non-growth region, and (c) a second crystal growth-derived layer located above the second growth region and the non-growth region; and
growing a first semiconductor layer on the first crystal growth-derived layer and growing a second semiconductor layer on the second crystal growth-derived layer, wherein:
  the first semiconductor layer and the second semiconductor layer are separated from each other and are adjacent to each other, and the first crystal growth-derived layer and the second crystal growth-derived layer are separated from each other,
  each of the first crystal growth-derived layer and the second crystal growth-derived layer has a lower portion joined to the substrate,
  the lower portion has a width that gradually increases with distance from the substrate, and
  the mask pattern is removed before the first semiconductor layer and the second semiconductor layer are formed.

9. A method for manufacturing a plurality of semiconductor devices each including a crystal growth-derived layer and a semiconductor layer, the method comprising:
preparing a crystal growth-derived-layer forming substrate including (a) a substrate having a first growth region and a second growth region defined by a non-growth region having a mask pattern, (b) a first crystal growth-derived layer located above the first growth region and the non-growth region, and (c) a second crystal growth-derived layer located above the second growth region and the non-growth region; and
growing a first semiconductor layer on the first crystal growth-derived layer and growing a second semiconductor layer on the second crystal growth-derived layer, wherein:
  the first semiconductor layer and the second semiconductor layer are separated from each other and are adjacent to each other, and the first crystal growth-derived layer and the second crystal growth-derived layer are separated from each other,
  each of the first crystal growth-derived layer and the second crystal growth-derived layer has a lower portion joined to the substrate,
  the lower portion has a width that gradually increases with distance from the substrate, and
  the substrate has a groove with which the mask pattern overlaps.

10. A method for manufacturing a plurality of semiconductor devices each including a crystal growth-derived layer and a semiconductor layer, the method comprising:
preparing a crystal growth-derived-layer forming substrate including (a) a substrate having a first growth region and a second growth region defined by a non-growth region, (b) a first crystal growth-derived layer located above the first growth region and the non-growth region, and (c) a second crystal growth-derived layer located above the second growth region and the non-growth region; and
growing a first semiconductor layer on the first crystal growth-derived layer and growing a second semiconductor layer on the second crystal growth-derived layer, wherein:
  the first semiconductor layer and the second semiconductor layer are separated from each other and are adjacent to each other, and the first crystal growth-derived layer and the second crystal growth-derived layer are separated from each other,
  each of the first crystal growth-derived layer and the second crystal growth-derived layer has a lower portion joined to the substrate and an upper portion located above of the lower portion,
  the lower portion has a width that gradually increases with distance from the substrate,
  the upper portion has a width that gradually decreases with distance from the lower portion, and
  the upper portion is smaller in thickness than the lower portion.

* * * * *